United States Patent
Leidy et al.

(10) Patent No.: US 6,716,559 B2
(45) Date of Patent: Apr. 6, 2004

(54) METHOD AND SYSTEM FOR DETERMINING OVERLAY TOLERANCE

(75) Inventors: Robert K. Leidy, Burlington, VT (US); Timothy C. Milmore, South Burlington, VT (US); Matthew C. Nicholls, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 10/016,211

(22) Filed: Dec. 13, 2001

(65) Prior Publication Data

US 2003/0113641 A1 Jun. 19, 2003

(51) Int. Cl.$^7$ ................................................ G03F 9/00
(52) U.S. Cl. ........................ 430/22; 430/30; 250/491.1; 356/399; 382/151; 438/975
(58) Field of Search .................. 430/22, 30; 250/491.1; 356/399; 382/151; 438/975

(56) References Cited

U.S. PATENT DOCUMENTS

| | | | |
|---|---|---|---|
| 4,347,479 A | * 8/1982 | Cullet ........................ 430/30 |
| 4,399,205 A | 8/1983 | Bergendahl ................. 430/30 |
| 5,124,927 A | 6/1992 | Hopewell et al. ........... 364/468 |
| 5,633,714 A | 5/1997 | Nyyssonen .................. 356/359 |
| 5,701,013 A | 12/1997 | Hsia et al. ................ 250/491.1 |
| 5,712,707 A | 1/1998 | Ausschnitt et al. ......... 356/401 |
| 6,130,750 A | 10/2000 | Ausschnitt et al. ......... 356/401 |
| 6,165,656 A | 12/2000 | Tomimatu .................... 430/22 |
| 6,218,200 B1 | 4/2001 | Chen et al. ................... 430/30 |
| 6,242,757 B1 | 6/2001 | Tzeng et al. .................. 257/48 |
| 6,251,745 B1 | 6/2001 | Yu ............................. 438/401 |

* cited by examiner

*Primary Examiner*—Christopher G. Young
(74) *Attorney, Agent, or Firm*—Scully, Scott, Murphy & Presser; William D. Sabo, Esq.

(57) ABSTRACT

A method and system for determining overlay tolerances. The method comprises the steps of exposing wafers at different critical dimensions (preferably, above, below, and at optimum image size); and varying the overlay across each wafer, preferably by intentionally increasing the magnification. Functional yield data are used to determine the overlay tolerance for each of the image sizes. The present invention, thus, studies the interaction of image size and feature misalignment. Prior to this invention, the only way to attain this information was to process a large number of lots and create a trend of image size and alignment vs. yield. The present invention solves the problem by determining the overlay tolerance based on yield data from a single lot. The design can then be altered or the overlay limit can be tightened (or relaxed) based on failure analysis of the regions/features that are most sensitive to misalignment.

18 Claims, 2 Drawing Sheets

METHOD OF DETERMINING OVERLAY TOLERANCE

EXPOSING WAFERS AT DIFFERENT CRITICAL DIMENSIONS

↓

VARYING THE OVERLAY ACROSS EACH WAFER

↓

USING FUNCTIONAL YIELD DATA TO DETERMINE THE OVERLAY TOLERANCE FOR EACH OF THE IMAGE SIZES

METHOD AND SYSTEM FOR DETERMINING OVERLAY TOLERANCE

BACKGROUND OF THE INVENTION

1. Field of the Invention

The present invention generally relates to photolithography processes, and more specifically, to a method and system for determining overlay tolerances in photolithographic processes.

2. Prior Art

Photolithography has a broad range of industrial applications, including the manufacture of semiconductors, flat panel displays, micromachines and disk heads. In many of these applications, multiple patterns are formed over, or on top of, one another. For example, generally speaking, integrated circuits may be made by using a series of photolithographic steps to form several layers of patterns on an underlying semiconductor substrate on which the integrated circuit is being made. Each layer may include patterns that are formed on or above patterns of one or more lower layers.

In many cases, patterns must be carefully aligned with lower patterns on the substrate. It is not necessary that these patterns be perfectly aligned, however, and some tolerance is permissible. Determining the proper tolerance between these patterns is an important aspect of the lithographic process. On the one hand, a tolerance that is too low, or tight, may significantly increase the cost and reduce the efficiency of the lithography process without any associated benefit in the performance or quality of the fabricated semiconductor. On the other hand, tolerances that are too high, or loose, may produce degraded product.

Various techniques are known to determine the optimum sizes of the patterns that are formed on the substrate. Process window experiments in photolithography typically consist of focus exposure matrices (which have no direct bearing on yield) or wafer striping; varying image sizes across the wafer to determine the optimum image size, which produces the best yielding chips. Striping provides image size tolerance by printing too large and too small, neither of these procedures consider overlay tolerance.

SUMMARY OF THE INVENTION

An object of this invention is to provide a method and system for determining overlay tolerances in photolithography processes.

Another object of the present invention is to provide a tool to determine true overlay tolerance at any image size.

With particular reference to FIG. 1, the present invention involves providing a product wafer, a portion of which is shown in the Figure. A planar insulating layer is deposited on the wafer. The insulating layer may be a chemical-vapor deposited (CVD) silicon oxide and is deposited to a thickness that is typically used on product wafers, such as between 3000 and 8000 Angstroms. Next, a photoresist layer is deposited on the product wafer, and this photoresist layer is then exposed to ultraviolet light through a first reticle. The first reticle is stepped across the wafer, for example by using a step-and-repeat tool, to form a series of images or patterns on the photoresist. This pattern is then transferred into the oxide using an etch process, and the features are filled with a conductive material. More insulator (oxide or low-K dielectric) is coated on the wafer, and the lithographic step begins again using a different reticle with a corresponding pattern. This process is repeated many times and various patterns are positioned over other patterns.

The present invention studies the interaction of image size and feature misalignment. Prior to this invention, the only way to attain this information was to process a large number of lots and to create a trend of image size and alignment vs. yield. The present invention solves the problem by determining the overlay tolerance based on yield data from a single lot. The design can then be altered or the overlay limit can be tightened (or relaxed) based on failure analysis of the regions/features that are most sensitive to misalignment.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

The preferred embodiment of this invention is now described in detail for using a two-dimensional scaling plot for efficiently and accurately determining the overlay tolerance when exposing photoresist layers on a wafer using a step-and-repeat or step-and-scan exposure tool. The overlay tolerance may then be used as input to the software or algorithm in the exposure tool during the photolithography process.

Figures 1, 2:
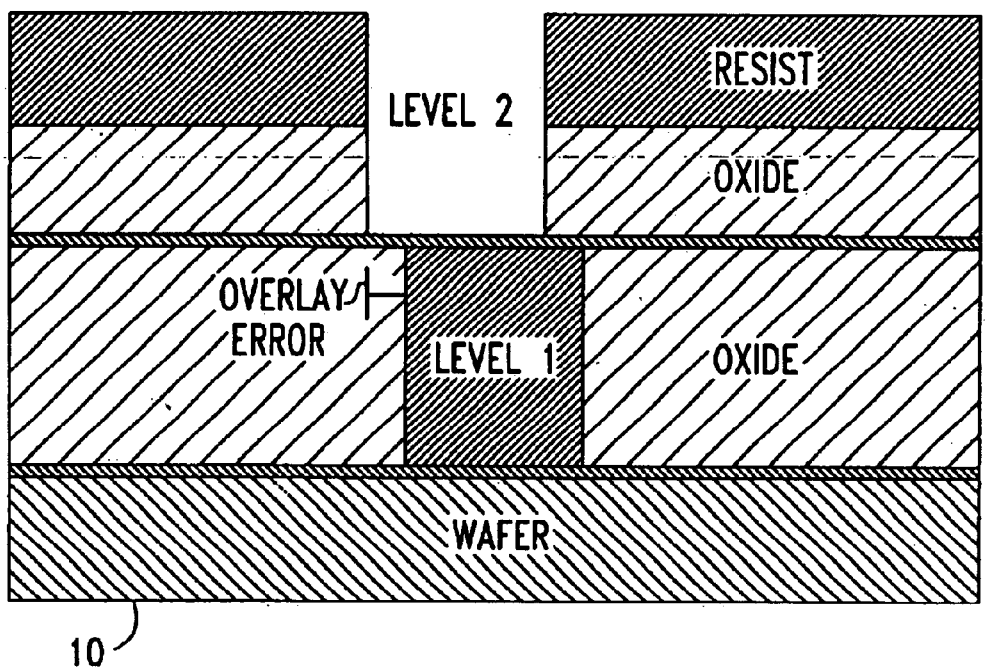
FIG. 1 illustrates a portion of a wafer.
FIG. 2 is a flow chart showing a preferred method of implementing this invention.

With particular reference to FIG. 1, the present invention involves providing a product wafer, a portion of which is shown at 10. A planar insulating layer is deposited on the wafer. This insulating layer may be a chemical-vapor deposited (CVD) silicon oxide and is deposited to a thickness that is typically used on product wafers, such as between 3000 and 8000 Angstroms. Next, a photoresist layer is deposited on the pilot wafer, and this photoresist layer is then exposed to radiation through a first reticle. The first reticle is stepped across the pilot wafer, for example by using a step-and-repeat tool, to form a series of images or patterns on the photoresist. The above-process may be repeated a number of times to form a series of layers of patterns on the wafer. In this procedure, typically, various patterns are positioned over other patterns.

As mentioned above, the present invention determines the effect of critical dimension (CD) on overlay tolerance. The invention utilizes the principal that this tolerance is a function of image size; therefore, increasing the image size reduces the overlay tolerance and decreasing critical dimension increases the overlay tolerance. For instance, tightening the overlay tolerance by 10 nm is virtually equivalent to reducing the critical dimension by 20 nm because overlay includes both a positive and a negative factor.

Figure 3A:
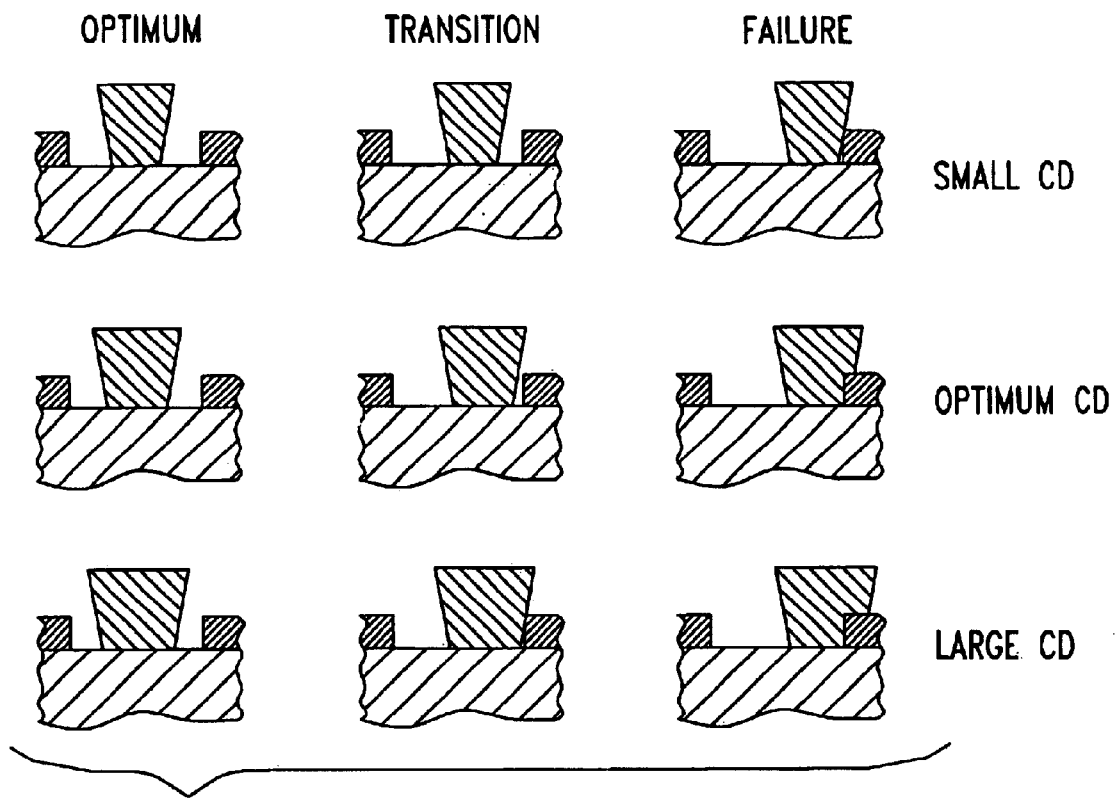
FIG. 3 illustrates the results of exposing the wafer at different critical dimensions.
Figure 3B:
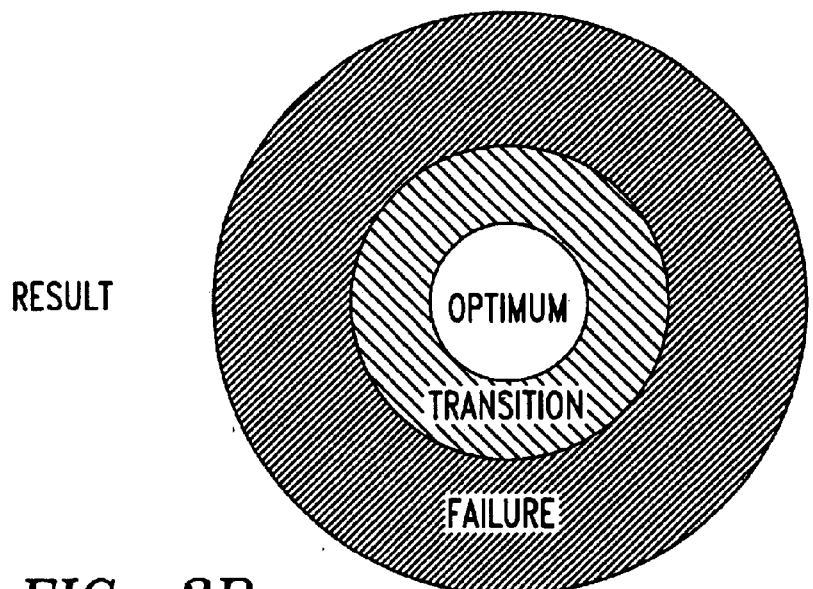

With reference to FIGS. 1–3, this invention determines the effect of critical dimension on overlay tolerance by exposing wafer 10 at different critical dimensions (above, below and at optimum image size), and varying the overlay across the wafer by intentionally increasing the magnification. The result is a different overlay/CD value for each chip involved. The wafer will exhibit a region of good chips transitioning to a region of bad chips. The good region will be larger for the smaller image size wafers. The overlay at which the bad region begins is the limit for that particular image size, thus functional yield dictates tolerance.

The procedure is straightforward when intentionally misaligning a single implant level. In the case of aligning to plural levels, if a level that is used for future level alignment is itself misaligned, then that future level is preferably misaligned the same magnitude but in the opposite direction (−1 instead of +1) in order to isolate the level in question.

The present invention thus provides process engineers with a valuable tool to determine the true overlay tolerance at any image size. If the technology requirements force a larger CD, this process will allow the engineer to find the proper tolerance rather than continue using the previous specification and risk degraded yield.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method of determining an acceptable overlay tolerance in a photolithography process, comprising the steps of:
    using a photolithography process to form first and second layers of patterns on a wafer, each of a set of patterns of said second layer being overlaid, with an associated overlay offset, with an associated one of the patterns of said first layer, including the steps of:
        i) exposing the wafer at different critical dimensions, and
        ii) varying the associated overlay offsets across the wafer; and
    using functional yield data from the wafer to determine an acceptable overlay tolerance for patterns of said first and second layers.

2. A method according to claim 1, wherein the step of using a photolithography process includes the step of exposing the wafers at critical dimensions relative to an optimum image size.

3. A method according to claim 2, wherein the step of exposing the wafers at critical dimensions includes the step of exposing the wafer at critical dimensions above, below and at the optimum image size.

4. A method according to claim 1, wherein the varying step includes the step of varying the overlay across the wafer by intentionally changing the magnification.

5. A method according to claim 4, wherein the step of varying the overlay across the wafer includes the step of varying the overlay offset across the wafer by intentionally increasing the magnification.

6. A method according to claim 1, wherein the step of using functional yield data includes the steps of:
    testing the wafers to identify a good region and a bed region; and
    identifying the overlay offset, at which the bad region begins, as said acceptable overlay tolerance.

7. A method according to claim 1, wherein the step of using a functional yield data includes the step of:
    searching the overlays across one of the wafers for a defined feature; and
    if the defined feature is found in one of the searched overlays, identifying the overlay tolerance of said one of the overlays as the acceptable overlay tolerance.

8. A system for determining acceptable overlay tolerance in a photolithography process, comprising:
    photolithography apparatus to form first and second layers of patterns on a wafer, each of a set of patterns of said second layer being overlaid, with an associated overlay offset, with an associated one of the patterns of said first layer, including
        i) means for exposing the wafer at different critical dimensions, and
        ii) means for varying the associated overlay offsets across the wafer; and
    means for using functional yield data from the wafer to determine an acceptable overlay tolerance for patterns of the first and second layers.

9. A system according to claim 8, wherein the photolithography apparatus includes means for exposing the wafers at critical dimensions relative to an optimum image size.

10. A system according to claim 9, wherein the means for exposing the wafers at critical dimensions includes means for exposing the wafer at critical dimensions above, below and at the optimum image size.

11. A system according to claim 8, wherein the varying means includes means for varying the overlay offset across the wafer by intentionally changing the magnification.

12. A system according to claim 11, wherein the means for varying the overlay offset across the wafer includes means for varying the overlay offset across the wafer by intentionally increasing the magnification.

13. A system according to claim 8, wherein the using means includes:
    means for testing the wafers to identify a good region and a bad region; and
    means for identifying the overlay offset, at which the bed region begins, as said acceptable overlay tolerance.

14. A system according to claim 8, wherein the using means includes:
    means for searching the overlays across the wafer for a defined feature; and
    if the defined feature is found in one of the searched overlays, means for identifying the overlay tolerance of said one of the overlays as the acceptable overlay tolerance.

15. A method of determining an acceptable overlay tolerance in a photolithography process, comprising the steps of:
    providing a multitude of wafers;
    for each of the wafers,
        i) using a photolithography process to form first and second layers of patterns on a wafer, each of a set of patterns of said second layer being overlaid, with an associated overlay offset, with an associated one of the patterns of said first layer,
        ii) exposing the wafer at different critical dimensions, and
        iii) varying the associated overlay offsets across the wafer; and
    using functional yield data from the wafers to determine acceptable overlay tolerances for patterns of said first and second layers.

16. A method according to claim 15, wherein,
    said set of patterns including multiple images sizes; and
    the step of using functional yield data includes the step of using the functional yield data to determining an acceptable overlay tolerance for each of said image sizes.

17. A method according to claim 15, wherein the varying step includes the step of varying the offsets across the wafer by changing the magnification.

18. A method according to claim 15, wherein the varying step includes the step of varying the offsets across wafer by increasing the magnification.

* * * * *